United States Patent [19]

Nozaki

[11] Patent Number: 4,892,348
[45] Date of Patent: Jan. 9, 1990

[54] CONSTRUCTION OF LOWER PART OF DOOR IN MOTOR VEHICLE

[75] Inventor: Masahiro Nozaki, Ama, Japan

[73] Assignee: Toyoda Gosei Co., Ltd., Nishikasugai, Japan

[21] Appl. No.: 304,658

[22] Filed: Feb. 1, 1989

[30] Foreign Application Priority Data

Mar. 24, 1988 [JP] Japan .................................. 63-38600
Mar. 31, 1988 [JP] Japan .................................. 63-43868
Sep. 26, 1988 [JP] Japan .................................. 63-125818

[51] Int. Cl.$^4$ ............................................. B62D 27/00
[52] U.S. Cl. ..................................... 296/146; 296/901
[58] Field of Search ............... 296/901, 146, 209, 199

[56] References Cited

U.S. PATENT DOCUMENTS

| | | | |
|---|---|---|---|
| 4,355,841 | 10/1982 | Ghidella et al. | 296/901 |
| 4,493,506 | 1/1985 | Alexander | 296/209 |
| 4,564,232 | 1/1986 | Fujimori et al. | 296/146 |

FOREIGN PATENT DOCUMENTS 2507204 9/1976 Fed. Rep. of Germany .
2945836 5/1981 Fed. Rep. of Germany .

Primary Examiner—Robert R. Song
Attorney, Agent, or Firm—Cushman, Darby & Cushman

[57] ABSTRACT

A construction of a lower part of a door of a motor vehicle has a broad moulding-shaped cover plate attached to an outer surface of a lower portion of a door outer panel, and a seal member attached along a lower edge of the cover plate for sealing a space between a lower edge of the cover plate and a rocker panel. The seal member is formed of an elastic material and has a base portion retained by the lower edge of the cover plate, a projecting portion integrally formed with and projecting like a lip from the base portion so that an end thereof is in pressure contact with the outer surface of the door outer panel, and a sealing portion extending downward from the base portion like a lip so that a lower end thereof is brought into contact with the rocker panel when the door is closed.

6 Claims, 5 Drawing Sheets

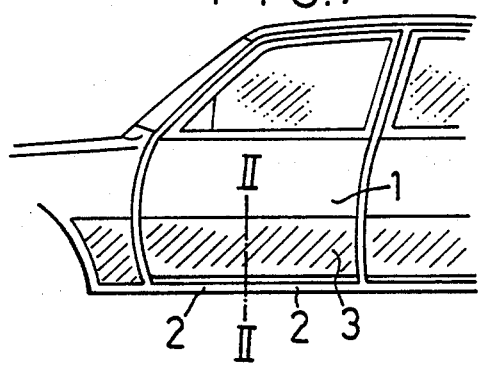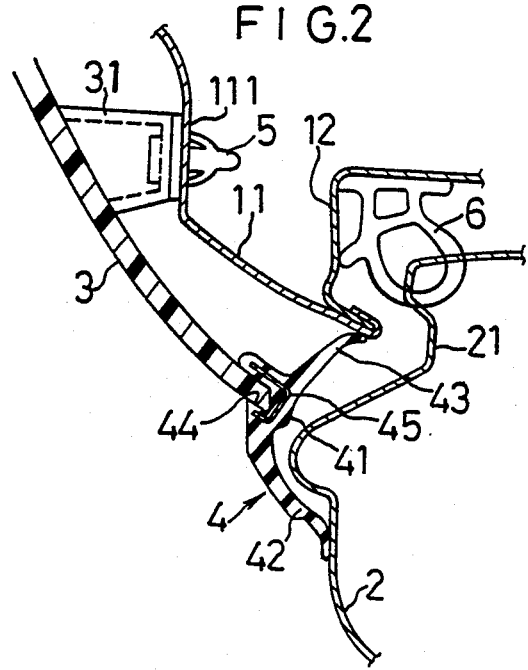

CONSTRUCTION OF LOWER PART OF DOOR IN MOTOR VEHICLE

BACKGROUND OF THE INVENTION

1. Field of the Invention

The present invention relates to a construction of a door in a motor vehicle, and more particularly to a construction of a lower part thereof.

2. Description of the Prior Art

In a motor vehicle, a stepped portion of a rocker panel extending along each of side edges of a vehicle floor is apt to be soiled with dust and muddy water entering from a space between a lower edge of a vehicle door and the rocker panel. In order to prevent this entrance of dust and muddy water, it has been proposed to mount a seal member along a lower edge of a vehicle door so that an end thereof is brought into contact with the rocker panel when the door is closed(German Patent Nos. 2507204 and 2945836).

Meanwhile, recently, motor vehicles, each being provided with a broad moulding-shaped cover plate 3 as shown in FIG. 7, have been increased for preventing an outer surface of a lower portion of a door outer panel 11 from being injured by pebbles spattered by tires. This cover plate 3 is generally attached to the outer surface of the lower portion of the door outer panel 11 by clips 5 in the central portion in the widthwise direction of the cover plate 3 at predetermined intervals in a longitudinal direction thereof. In FIG. 7, the reference numeral 2 designates a rocker panel.

However, while the motor vehicle is running or when the door is closed, this cover plate vibrates in its lower end portion. In particular, when the door is forcefully closed or the motor vehicle is running on a rough road, the cover plate 3 has a problem of generating undesirable vibration noise. Moreover, in the case of a lower edge of the cover plate 3 being positioned adjacently to the opposed door outer panel 11, there occurs a problem that the vibrating lower edge of the cover plate 2 interferes with the door outer panel 11 to injure the coating of the door outer panel 11 an incur the generation of rust when the lower edge of the cover plate 3 is attached close to the door outer panel 11 at a distance smaller than a predetermined distance due to the scattering in attaching of the cover plate 3.

SUMMARY OF THE INVENTION

It is a main object of the present invention to provide a door of a motor vehicle, provided with a cover plate for protecting an outer surface of a lower part of the door, and seal means for sealing a space between a lower edge of the cover plate and a rocker panel.

More specifically, it is an object of the present invention to provide a door of a motor vehicle, provided with a cover plate and seal means, by which both the generation of vibration noise of the cover plate and the interference of the cover plate with a door outer panel can be prevented.

According to the present invention, a seal member formed of rubber or synthetic resin is attached along a lower edge of a cover plate. This seal member is composed of a base portion which is attached along the lower edge of the cover plate in pressure contact with an outer surface of a lower portion of a door outer panel, and a sealing portion extending downward from the base portion like a lip, an end of the sealing portion being brought in pressure contact with a rocker panel when a door is closed.

In the case of the space between the lower edge of the cover plate and the door outer panel being large, a projecting portion is integrally formed with the base portion to be brought in pressure contact with the door outer panel. In the case of the above space being small, the base portion is formed thick to be brought in pressure contact with the door outer panel.

According to the present invention, the seal member seals the space between the lower edge of the cover plate and the rocker panel. And also, the vibration of the lower edge of the cover plate is absorbed by virtue of the base portion of the seal member, which is interposed between the cover plate and the door outer panel, to prevent the generation of the vibration noise.

BRIEF EXPLANATION OF THE DRAWINGS

FIGS. 1 and 2 illustrate a first embodiment of a construction of a lower part of a door in a motor vehicle according to the present invention;

FIG. 1 is a front view of the door of the motor vehicle;

FIG. 2 is a sectional view of a lower part of the door taken along the line II—II of FIG. 1;

DETAILED DESCRIPTION OF THE EMBODIMENTS

[Embodiment 1]

Figure 3:
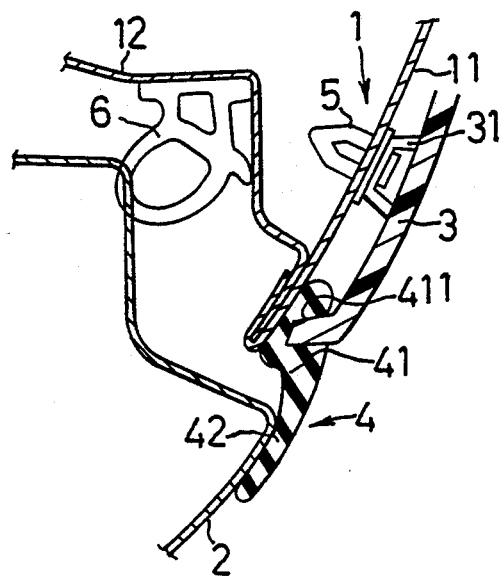
FIG. 3 illustrates a second embodiment of a construction of a lower part of a door in a motor vehicle according to the present invention.

FIGS. 1 and 2 illustrate a first embodiment of a construction of a lower part of a motor vehicle door according to the present invention.

In a motor vehicle 1, a broad moulding-shaped cover plate 3 formed of solid synthetic resin is mounted on an outer surface of a lower portion of a door outer panel 11 so as to cover the lower portion thereof.

The door outer panel 11 is provided with a vertical surface 111 in its lower portion. And a downward extending lower end thereof is opposed to a recess 21 formed in an upper portion of a rocker panel 2.

The cover plate 3 is attached to the door outer panel 11 by fixing a stay 31 projecting from a rear surface of the cover plate 3 at the center in the widthwise direction of the cover plate 3 to the vertical surface 111 of the door outer panel 11 with a clip 5 thereby to define a wide space between the lower end of the cover plate 3 and the lower end of the door outer panel 11.

A seal member 4 formed of solid rubber or synthetic resin, and having flexibility larger than that of the cover plate 3 is attached to the lower edge of the cover plate 3. On a door inner panel 12 is mounted a weather strip 6 of which a hollow seal portion is contacted with the rocker panel 2 when the door is closed. This weather strip 6 provides a double seal together with the seal member 4. The seal member 4 is provided with a base portion 41 to be attached to the lower edge of the cover plate 3, and a sealing portion 42 extending downward like a lip. When the door is closed, the sealing portion 42 forms a continuous surface with the outer surface of a lower half portion of the rocker panel 2, and an end of the sealing portion 42 is brought into pressure contact with the rocker panel 2. The base portion 41 is integrally provided with a projecting portion 43 extending toward a vehicle body like a lip. An end of the projecting portion 43 is in pressure contact with the lower end of the door outer panel 11. The base portion 41 is provided with a U-shaped recess 44 and a metal core 45 is embedded in the base portion 41. In the U-shaped recess 44 is firmly fitted and retained a lower end of the cover plate 3. The above-described seal member 4 can be easily formed integrally by an extruding process or the like.

In the construction of a lower part of a vehicle door having the above-described structure, vibrations generated in the lower end of the cover plate 3 is absorbed by virtue of the projecting portion 43 extending from the lower end of the cover plate 3 to the lower end of the door outer panel 11. Hence, even when the door is forcefully closed or a motor vehicle is running on a rough road, the vibration noise is prevented from being generated in the lower end of the cover plate 3. At the same time, by virtue of the seal member 4, a seal is effected between the cover plate 3 and the rocker panel 2 to prevent the stepped portion of the rocker panel 2 from being soiled with dust and muddy water entering through the space therebetween.

[Embodiment 2]

FIG. 3 illustrates a second embodiment of a construction according to the present invention. The broad moulding-shaped cover plate 3 formed of synthetic resin is attached to the outer surface of the lower portion of the door outer panel 11 so as to cover the lower portion thereof. The cover plate 3 is attached to the door outer panel 11 by fixing the stay 31 projecting from the rear surface of the cover plate 3 at a center in the widthwise direction of the cover plate 3 to the door outer panel 11 with the clip 5.

The seal member 4 is mounted on the lower end of the cover plate 3 in pressure contact with the outer surface of the door outer panel 11. To the inner panel 12 of the door 1 is attached the weather strip 6 of which a hollow sealing portion comes in contact with the rocker panel 2 inside the seal member 4. The weather strip 6 provides a double seal together with the seal member 4.

The seal member 4 is formed of rubber or synthetic resin, and is provided with a base portion 41 and a sealing portion 42 extending downward from the base portion 41 like a lip. A downward extending lower end of the sealing portion 42 is brought into contact with the rocker panel 2 when the door 1 is closed. A lower end of the cover plate 3 is fitted in a recess 411 formed in the base portion 41, and joined thereto by an adhesive agent. The base portion 41 is formed thick and is forcedly inserted between the lower end of the cover plate 3 and the adjacently opposing door outer panel 11. This results in the inner surface of the base portion 41 coming in pressure contact with the door outer panel 11.

Figure 4:
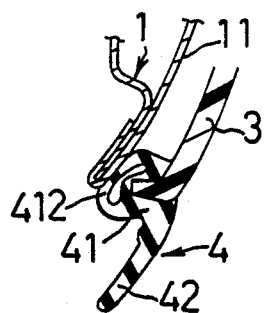
FIGS. 4 and 5 respectively illustrate a modified embodiment of the second embodiment.

FIG. 4 illustrates a modified embodiment of the seal member. The base portion 41 is provided with a hollow portion 412 which is forcedly inserted between the lower end of the cover plate 3 and the lower end of the door outer panel 11.

Figure 5:
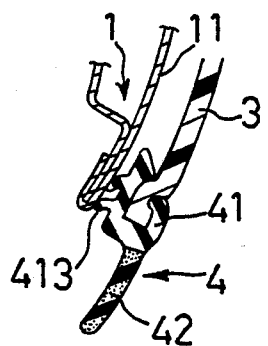

FIG. 5 is another modified embodiment of the seal member. The lower end of the cover plate 3 is bent so as to have a C-shaped cross section. The base portion 41 of the seal member 4 has a U-shaped cross section and is fitted to the lower end of the cover plate 3 so as to cover it. The inner surface of the base portion 41 is provided with inwardly extending lip-shaped projections 413 which are respectively in pressure contact with the lower end of the door outer panel 11.

The base portion 41 is formed of solid rubber or synthetic resin while the projections 413 and the sealing portion 42 are formed of soft rubber or synthetic resin.

In the preceding embodiments, a seal is provided between the cover plate 3 and the rocker panel 2, and dust or the like can be prevented from entering into the space therebetween. Moreover, in the preceding embodiments, the base portion 41 of the seal member 4 is attached to the lower end of the cover plate 3 with one portion of the base portion 41 forcedly inserted between the cover plate 3 and the door 1. By virtue of this construction, the vibration of the lower end of the cover plate 3 can be absorbed. In addition, the lower end of the cover plate 3 can be prevented from interfering with the door outer panel 11, accordingly damaging the coating surface thereof.

And, by virtue of the deformability of the hollow portion 412 or the projections 413 provided in the base portion 41, the seal members 4 shown in FIGS. 4 and 5 can be applied to the vehicles of which the gap between the lower end of the cover plate 3 and the lower end of the door outer panel 11 is different from each other. Moreover, in the seal member shown in FIG. 5, the base portion 41 can be surely attached to the cover plate 3 without using any adhesive agent.

[Reference Example]

Figure 6:
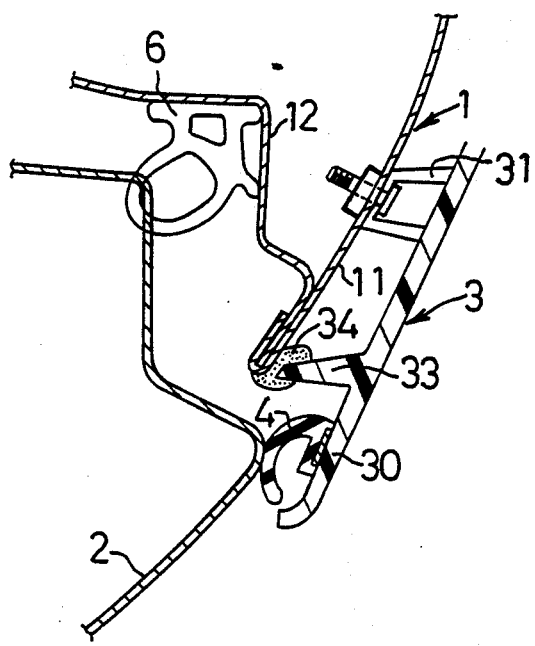
FIG. 6 is a sectional view of a reference example of a construction of a lower part of a door in a motor vehicle.
Figure 7:
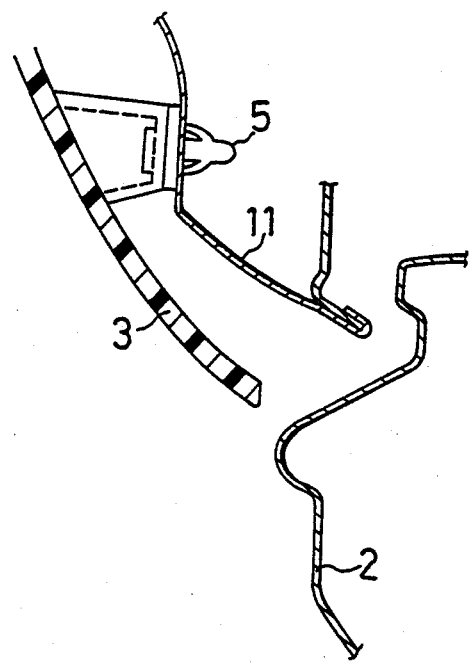
FIG. 7 is a sectional view of a lower part of a conventional motor vehicle door.

FIG. 6 illustrates a reference example of a construction of a lower part of a vehicle door, which was thought out by the present inventors. A lower portion 30 of the cover plate 3 downward extends under the the lower edge of the door outer panel 11. And the seal member 4 is attached to an inner surface of the lower portion 30 so as to come in pressure contact with the rocker panel 2. A rib 33 projects from the inner surface of the cover plate 3, and a pad member 34 is interposed between the rib 33 and the lower end of the door outer panel 11.

In this construction, the seal member 4 is not exposed to the outside of the vehicle body so that the external appearance of the lower portion of the cover plate 3 becomes neat and smart, and accordingly is desirable from an aesthetic point of view. However, this construction has a problem that for preventing the vibrations of the cover plate 3, the pad member 34 is required to be interposed between the cover plate 3 and the door outer panel 11 in addition to the seal member 4.

In contrast, the construction of the preceding embodiments can provide a seal between the lower end of the cover plate and the rocker panel, and also prevent the vibrations of the cover plate by attaching the seal member to the lower end of the cover plate.

What is claimed is:

1. A construction of a lower part of a door of a motor vehicle, comprising:
   a broad moulding-shaped cover plate attached to an outer surface of a lower portion of a door outer panel so as to cover the lower portion thereof; and a seal member attached along a lower edge of said cover plate for sealing a space between a lower edge of said cover plate and a rocker panel; said seal member being formed of an elastic material, and provided with a base portion retained by said lower edge of said cover plate in pressure contact with the outer surface of the door outer panel, which is opposed to said lower edge of said cover plate, and a sealing portion which extends downward from said base portion like a lip and of which a lower end is brought into contact with said rocker panel when the door is closed.

2. A construction according to claim 1, wherein said seal member is further provided with a projecting portion integrally formed with a projecting like a lip from said base portion in a direction of said door outer panel, and an end of said projecting portion is in pressure contact with said door outer panel.

3. A construction according to claim 3, wherein said base portion of said seal member is formed thicker than said sealing portion, and retained by said lower edge of said cover plate so as to cover said lower edge, and an inner surface of said base portion is in pressure contact with the door outer panel.

4. A construction according to claim 3, wherein said base portion has a hollow portion which is interposed between said lower edge of said cover plate and said door outer panel in pressure contact therewith.

5. A construction according to claim 3, wherein said inner surface of said base portion is provided with at least one lip-shaped projection which is in pressure contact with the door outer panel.

6. A construction according to claim 1, wherein said cover plate is formed of solid rubber or synthetic resin, and said seal member is formed of rubber or synthetic resin having flexibility larger than said cover plate.

* * * * *